(12) United States Patent
West

(10) Patent No.: US 8,723,370 B2
(45) Date of Patent: May 13, 2014

(54) PHOTOVOLTAIC STRING SUB-COMBINER

(75) Inventor: Richard Travis West, Ragged Point, CA (US)

(73) Assignee: Renewable Power Conversion, Inc., San Luis Obispo, CA (US)

( * ) Notice: Subject to any disclaimer, the term of this patent is extended or adjusted under 35 U.S.C. 154(b) by 0 days.

(21) Appl. No.: 13/221,615

(22) Filed: Aug. 30, 2011

(65) Prior Publication Data

US 2011/0308833 A1    Dec. 22, 2011

(51) Int. Cl.
*H05K 5/06* (2006.01)

(52) U.S. Cl.
USPC ............. 307/145; 307/146; 307/147; 307/42; 307/77; 307/78

(58) Field of Classification Search
USPC ............. 307/145–147, 42, 77, 78, 61, 63, 66; 320/117, 126
See application file for complete search history.

(56) References Cited

U.S. PATENT DOCUMENTS

| | | | | |
|---|---|---|---|---|
| 4,670,661 | A * | 6/1987 | Ishikawa | 307/66 |
| 6,268,559 | B1 * | 7/2001 | Yamawaki | 136/244 |
| 7,057,105 | B2 * | 6/2006 | Gottardo et al. | 174/50 |
| 2004/0147172 | A1 * | 7/2004 | Brown et al. | 439/701 |
| 2009/0207543 | A1 * | 8/2009 | Boniface et al. | 361/86 |
| 2010/0139734 | A1 * | 6/2010 | Hadar et al. | 136/244 |
| 2010/0237703 | A1 * | 9/2010 | Stern | 307/77 |
| 2010/0263714 | A1 * | 10/2010 | Lauermann et al. | 136/251 |
| 2011/0209741 | A1 * | 9/2011 | Solon | 136/244 |

FOREIGN PATENT DOCUMENTS

JP          2002058152 A  *  2/2002
WO   WO 2010025223 A2  *  3/2010

OTHER PUBLICATIONS

Machine translation for JP2002-058152.*

* cited by examiner

*Primary Examiner* — Fritz M Fleming

(57) ABSTRACT

An improved method of collecting DC power in solar photovoltaic systems is disclosed where series string overcurrent protection is provided at distributed series string terminus locations and a tap connection is made to higher current conductors carrying the combined currents of a number of series strings. A number of related string combiner methods and embodiments are disclosed.

20 Claims, 6 Drawing Sheets

FIG 2A - PRIOR ART

DETAIL

FIG 2C - PRIOR ART

PHOTOVOLTAIC STRING SUB-COMBINER

BACKGROUND OF THE INVENTION

In solar photovoltaic systems, modules are typically connected in series-parallel arrangements. Series-aiding strings of twelve or more modules are common. The number of modules per string sets the system voltage. The number of series strings wired in parallel sets or is proportional to the system power. Large, prior art central-inverter-based systems use two tiers of DC power collection. First, a number of series strings are routed to a field combiner box which provides overcurrent protection, via a fuse, for each string conductor (and series module in that string) and combines, or electrically parallels, all string circuits at a field combiner box output. Second, each field combiner box output is routed to a master combiner box input. The master combiner box provides overcurrent protection for conductors between the field combiner boxes and the master combiner box and combines all the field combiner box outputs into a single DC feed for the central inverter. The master combiner box is typically adjacent to the central inverter and field combiner boxes are distributed throughout the array field.

Functionally, all fuses in a photovoltaic system are primarily there to protect from backfed currents. For example, if one series string in a megawatt-scale system is shorted, the available fault current will be the short circuit current of the entire megawatt photovoltaic source. The National Electric Code specifies that all conductors in a photovoltaic system be protected from all sources of current; current in the normal direction of flow as well as backfed current.

Fault currents from photovoltaic sources are very different from fault currents in AC systems because shorted photovoltaic sources behave like current sources. A shorted series string of irradiated photovoltaic modules will typically source only 10% more current than under normal operating conditions. As such, series string fuses are sized to never clear in the direction of forward current.

The cost of providing overcurrent protection for every series string is significant and more so in systems employing thin-film solar modules. Thin-film module currents are typically 4 to 5 times less than crystalline module currents. As such, the number of fuses and conductor runs to field combiner boxes are typically 4 to 5 times greater.

BRIEF SUMMARY OF THE INVENTION

The invention enables improvements in solar photovoltaic (PV) system DC power collection.

The preferred embodiment is a sealed sub-combiner unit for combining a small number of series strings, at the field terminus location of these series strings, in order to significantly reduce the number of conductors run to the field combiner box location or to the next tier of DC power collection. The sub-combiner is fitted with standard connectors for direct attachment to solar modules. The invention leverages the fact that series string fuses rarely open. As such, the cost and safety issues of providing access to these fuses are eliminated. If a fuse does clear, the small, low cost sub-combiner is designed for plug-and-play replacement. There are, by design, no user-serviceable sub-combiner parts. In one embodiment, the sub-combiner is potted to significantly enhance the environmental integrity of this approach over prior art methods and to further reduce the size and therefore the cost of materials per series string connection.

A second and closely related embodiment is a method of completely eliminating prior-art string combiner boxes by creating a two-conductor monopolar or three-conductor bipolar DC power collection buss for each master combiner or "home run" circuit. Each series string will tap into the applicable DC buss conductor via a local fused or non-fused (depending on the grounding disposition of the conductor) sub-combiner close to the terminus of two to eight series strings.

UTILITY OF THE INVENTION

The invention finds the greatest utility when used with thin-film photovoltaic cell technologies where the number of series strings, and therefore required string fuses and support infrastructure, is typically 4 to 5 times the cost of that required for crystalline cell technologies.

The invention can significantly reduce material costs, labor costs and normalized $I^2R$ losses associated with DC power collection. The total weight of copper in series string-to-combiner circuit runs, in thin-film applications, can be reduced by approximately 67%. The number of field wiring connections can be reduced by an order of magnitude. Unskilled personnel can change out a blown fuse by simply replacing the entire touch-safe sub-combiner.

The invention leverages two principles. First, the fact that in a well designed PV system only 1 in 5,000 fuses may clear in the lifetime of that system, making ease of fuse replacement a cost ineffective luxury. Second, the maturity of the photovoltaic industry is recognized where ease of circuit access, via a conveniently located combiner box for troubleshooting, now provides less value than does the cost reduction, enhanced reliability, system simplification and enhanced personnel safety enabled by the invention. In lieu of intentionally opening string circuits and probing hot string conductors with a voltmeter, troubleshooting can be accomplished at distributed sub-combiner locations with a clamp-on DC current probe with no exposure to hazardous voltages.

Typical "failures" in state-of-the-art PV combiner boxes may not be directly caused by the intended clearing of a fuse. In most cases thermal cycling, condensation, particulate contamination, insect intrusion and/or corrosion may cause high resistance contacts between wiring terminals and fuse to fuse holder contact areas. In some cases and over time, this may cause fuses to operate at higher than rated temperatures so that a 10 A fuse effectively becomes a 7 A fuse and may clear. In other cases, power production from a series string may cease with the fuse intact as terminals oxidize and corrode to a point where contacts become insulators.

The invention provides a sealed environment for fuses and connections. In one embodiment of the invention, fuses and conductors to/from MC4 connectors are soldered to a PCB (Printed Circuit Board) assembly and the entire assembly is potted with a thermally conductive encapsulant. The resulting IP67 or NEMA 6 rated sub-combiner may provide long term reliability figures ten times that of any state-of-the-art PV string combiner equipment.

DETAILED DESCRIPTION OF THE INVENTION

FIG. 1 shows a preferred embodiment of the invention as a sub-combiner for combining positive conductors from two series strings as well as supplying positive buss input and output connectors.

Figure 1A:
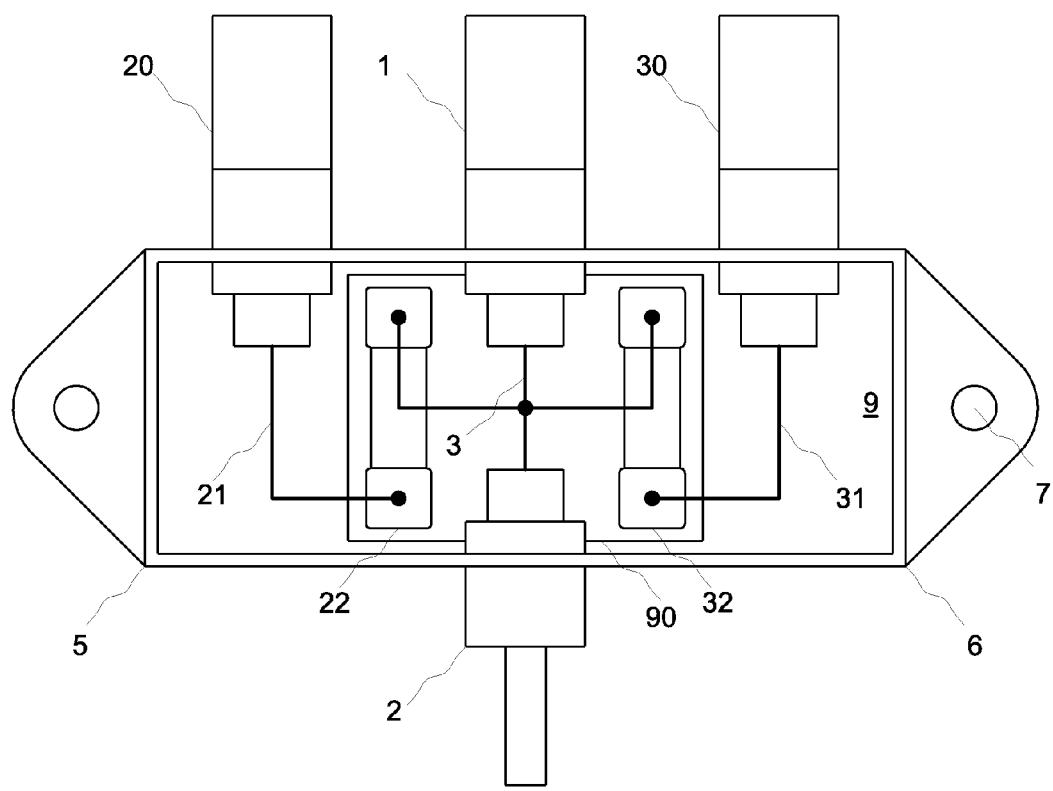
FIG. 1 illustrates a layout and electrical connections for a two input combiner with input and output DC buss connectors.

FIG. 1A shows a top view of the sub-combiner. Connectors 1, 20, 30 are standard male MC4 conductors, the type that mate with the positive connector on a standard PV module. Connector 2 is a standard female MC4 conductor, the type that mates with the negative connector on a standard PV module or, as in this case, the type that are used to extend the conductor length of a positive circuit. Electrical connections 21 and 31 are made from connectors 20 and 30 to one end of fuses 22 and 32, respectively. The remaining ends of fuses 22 and 32 are electrically connected in common with connectors 1 and 2 as shown by circuit 3. Fuses 22 and 32 are soldered to printed circuit board 90. In practice, connectors 20 and 30 will each be connected to the positive pole of the last module in a unique series string. The sub-combiner is intended for use with other sub-combiners where output connector 2 of the first sub-combiner in a daisy-chain will connect through an appropriately MC4-terminated cable to input connector 1 of the second sub-combiner in the daisy chain and so on, such that circuit 3 is common to all sub-combiners and acts as a positive DC power collection buss. For example, in a four sub-combiner daisy-chain, the current out of terminal 2 of the fourth sub-combiner will be the sum of eight series string currents. Reference designator 7 indicates one of two mounting holes.

Figure 1B:
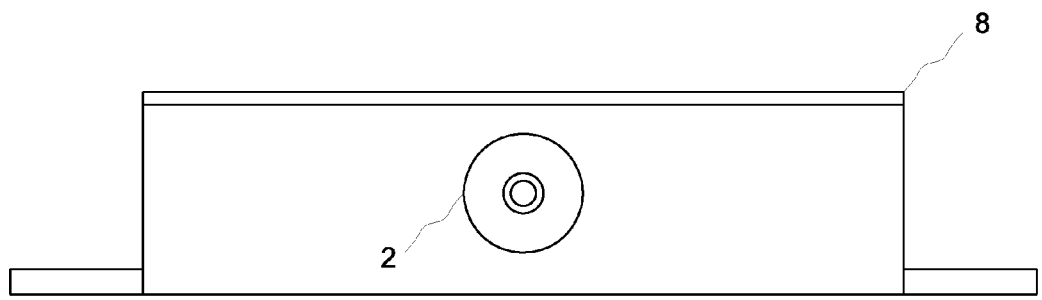

FIG. 1B shows a side view of the sub-combiner with cover 8 in place. In this embodiment of the invention, cover 8 may be glued, welded or otherwise permanently affixed. Enclosure 6 may also be filled with an electrically insulating potting material 9, shown in FIG. 1A, to provide a higher level of environmental integrity, to reduce circuit spacing requirements or to prevent exposure to hazardous voltages. If cover 8 is not used, then enclosure 6 will be filled with an electrically insulating filler to cover all live components. The filler may also be thermally conductive in order to transfer waste heat generated by the fuses. In either case, the sub-combiner will be environmentally sealed to IP67 or NEMA 6, will be touch-safe and will have no user serviceable components.

In FIG. 1, if the grounded conductors of a series string were being combined the sub-combiner would be identical to that in FIG. 1 except that fuses 22 and 32 would be replaced by short circuits.

FIG. 2 illustrates the advantages of the invention compared to prior art solutions.

FIG. 2A illustrates typical prior art DC power collection from a photovoltaic subarray with eight series strings, A through H, each comprising fourteen thin-film modules. In FIG. 2A module-to-module connections are not shown, for clarity.

FIG. 2C is a detail of the dashed-line area shown in FIG. 2A. A pair of conductors must be routed from each of the eight series string circuits to a combiner box location X. Based on the layout shown with 1200 mm by 600 mm module dimensions, the total wire length is 300 m with a conductor cross section of 4 mm$^2$ (~14 AWG). The string current under nominal conditions is 1.32 A. Module dimensions and nominal current specifications are based on a widely used thin-film module.

Figure 2B:
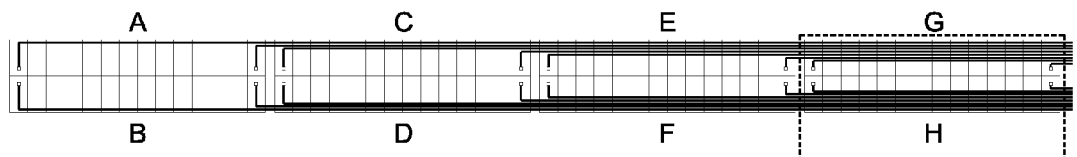
FIG. 2 compares the photovoltaic subarray DC power collection approach for a prior-art solution and a solution using the invention.
Figure 2B:
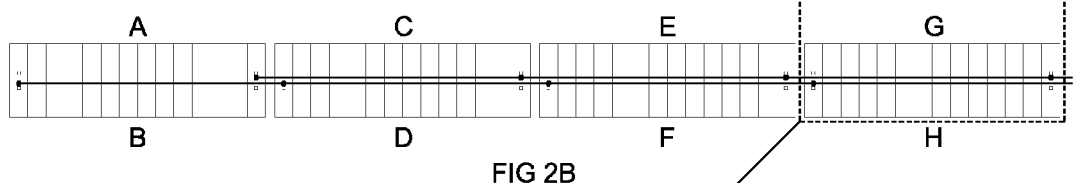
Figure 2D:
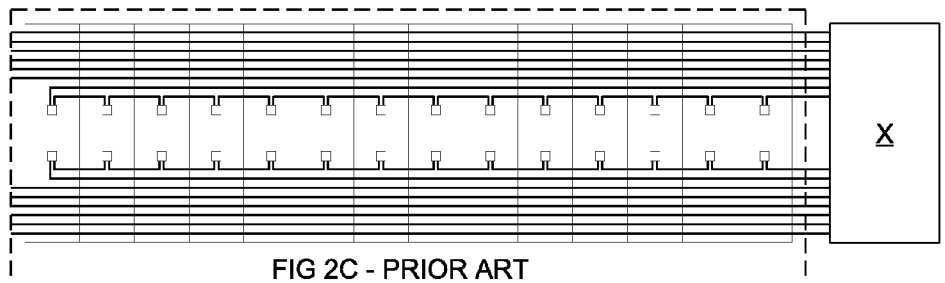
Figure 2D:
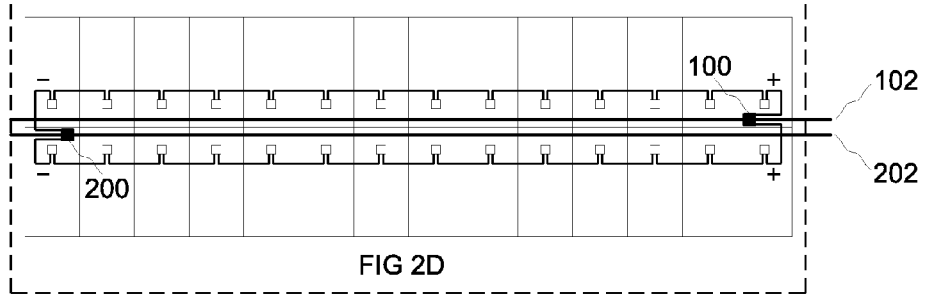

FIG. 2D is a detail of FIG. 2B and illustrates an improved DC power collection method using the sub-combiner described in FIG. 1. With this method the total wire length is 64 m with a conductor cross section of 6 mm$^2$ (~10 AWG). The ratios of copper length times cross section or therefore volume or weight is 3:1 for the prior art approach vs. the solution enabled by the invention and for the conductors shown in FIGS. 2A and 2B.

Figure 3:
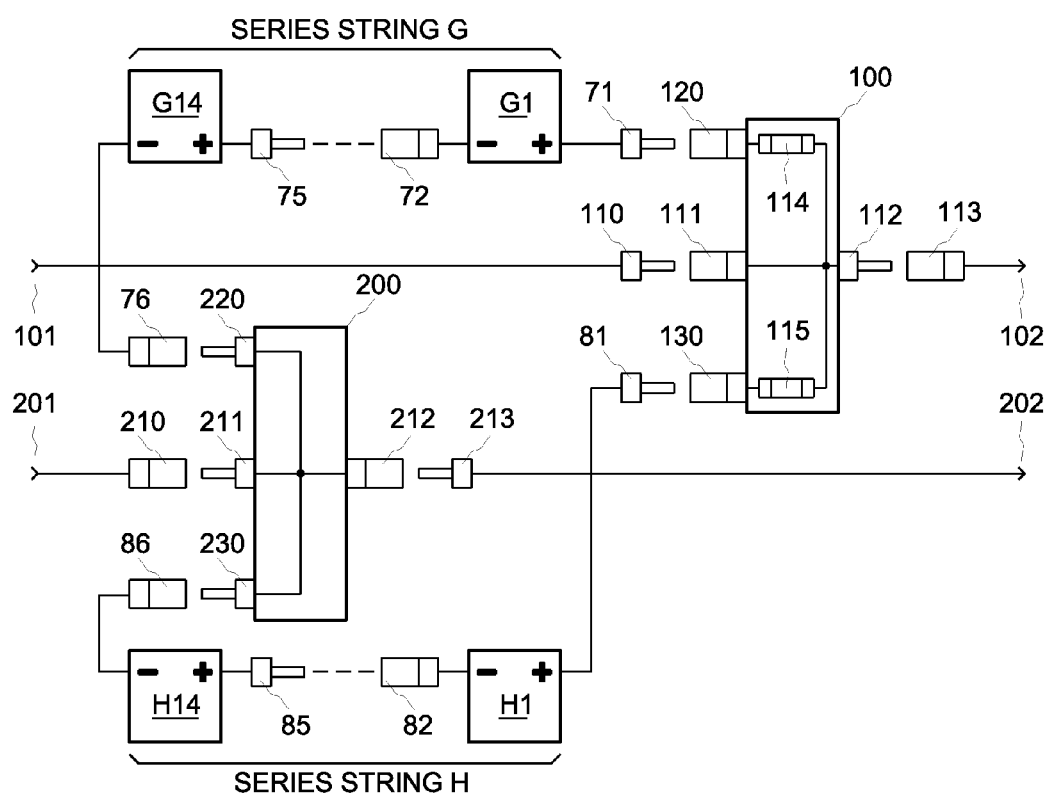
FIG. 3 details the electrical circuit of the solution in FIG. 2D using the invention.

FIG. 3 is a functional schematic of the power collection methodology illustrated in FIG. 2D and includes sub-combiners 100 and 200 as described in FIG. 1 and the associated FIG. 1 narrative. All plug-to-plug connections in FIG. 3 are shown disconnected so that the connector gender is well indicated. Because MC4 connectors are shrouded in order to be touch-safe, the gender descriptions and illustrations may not appear to agree. In FIG. 3, the positive DC buss is split into conductors 101 and 102, and are terminated with female MC4 connector 110 and male MC4 connector 113, respectively. In a similar way, the negative DC buss is split into conductors 201 and 202, and are terminated with male MC4 connector 210 and female MC4 connector 213, respectively. To complete the circuit, positive DC buss connectors 110 and 113 are plugged into sub-combiner high current inputs 111 and 112, respectively. In a similar way negative DC buss connectors 210 and 213 are plugged into sub-combiner high current inputs 211 and 212. In this application, the DC busses are split to enable daisy-chained power collections and touch-safe, plug-and-play installation and replacement of sub-combiners 100 and 200, although it is highly unlikely that non-fused sub-combiner 200 will ever need to be replaced. Series strings G and H are each made up of 14 thin-film solar modules connected in series with typical module-to-module interconnections as illustrated by connectors 75/72 and 85/82, respectively. Module-to-module connections interior to either string G or H are not shown for clarity. DC power is collected or currents combined by plugging female MC4 connector 71 and 81 from modules G1 and H1 into sub-combiner input ports 120 and 130, respectively. When connected, currents flow from strings G and H through fuses 114 and 115, respectively, and into DC buss conductor 102. In a similar way currents are combined by plugging male MC4 connector 76 and 86 from modules G14 and H14 into sub-combiner input ports 220 and 230, respectively. When connected, currents return from strings G and H through DC buss conductor 202.

By way of a more quantitative example, if PV modules with short circuit current ($I_{sc}$) ratings of ~2 A and sub-combiners supplied with 3.5 A fuses were used for the application described in FIGS. 2 and 3, then eight series strings could be combined into one 16 A ($I_{sc}$) circuit and the "DC buss conductors" could simply be 6 mm$^2$ Type PV wire. In this overall system scenario, three-tiers of DC power collection would be used; a sub-combiner tier, a field combiner box tier with one-eighth the fuses and conductors entering the combiner box and a master combiner box tier.

Figure 4:
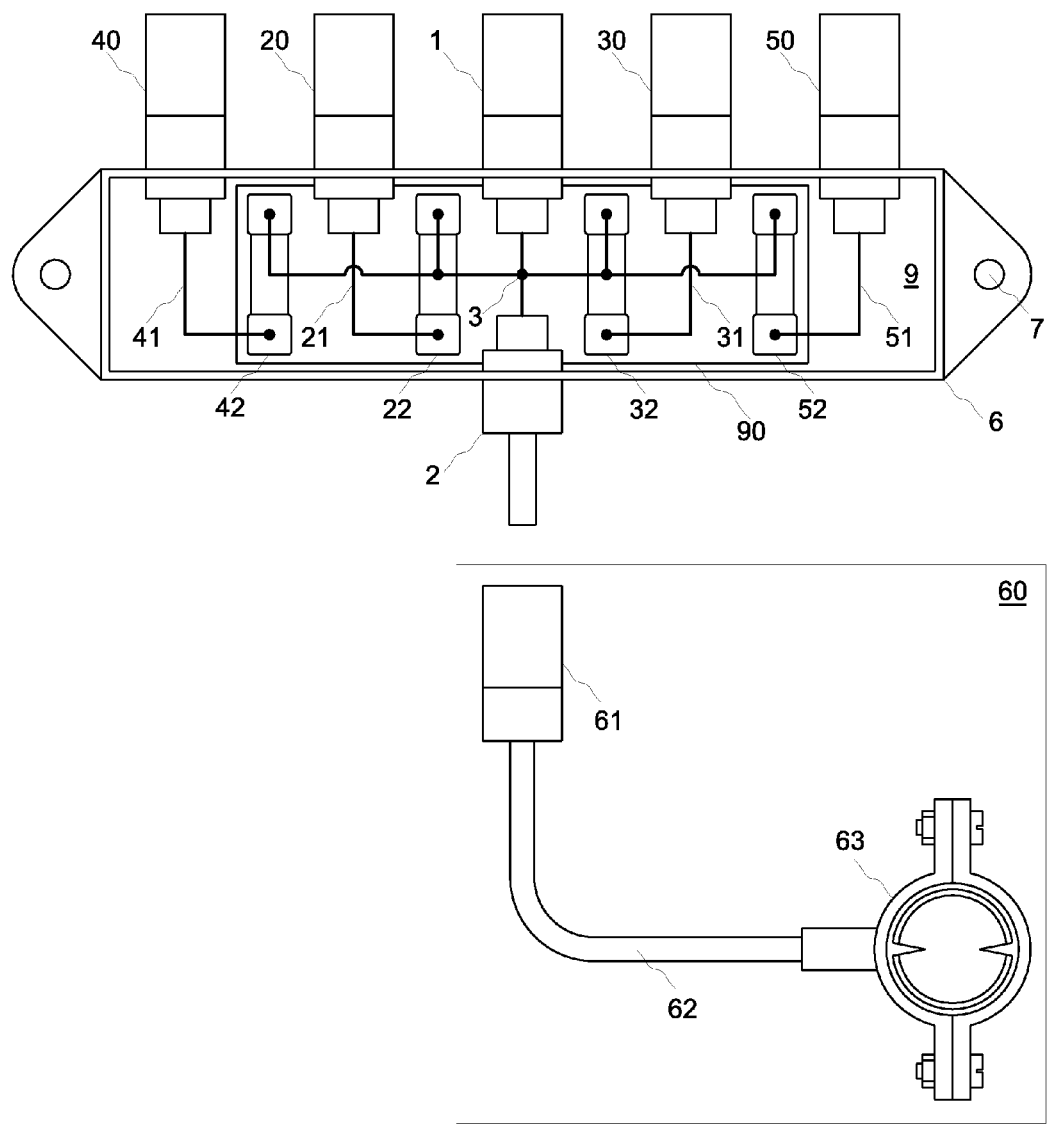
FIG. 4 illustrates a layout and electrical connections for a four input combiner with input and output DC buss connectors and an optional insulation displacement DC buss connector.

FIG. 4 illustrates a logical extension of the sub-combiner described in FIG. 1 but with four series string input connectors 20, 30, 40, 50 with circuit connections 21, 31, 41, 51 and fuses 22, 32, 42 and 52, respectively. Fuses 22, 32, 42 and 52 are soldered to printed circuit board 90. In some applications, the daisy-chain function may be extended to currents higher than the standard MC4 connector 30 A limit by deleting or not using input connector 1 and by using cable assembly 60, with male MC4 connector 61, conductor 62 and insulation displacement tap connector 63 where tap connector 63 is connected to a high current DC buss conductor. If the DC buss conductor is sized to carry the current of a master combiner or "home run" circuit, the traditional field combiner box can be eliminated. In lieu of an insulation displacement tap connector, a junction box could also facilitate this connection by breaking the buss conductors and connecting each end to a common terminal block inside the junction box. A lower current connection from the same terminal block will also be made to a bulkhead MC4 connector accessible from the exterior of the junction box. In this way, touch-safe plug-and-play installation and replacement of the combiner box may also be accommodated.

Figure 5A:
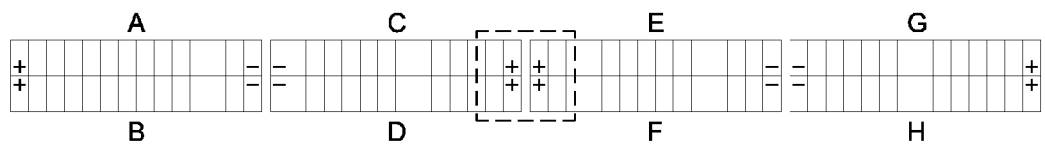
FIG. 5 is a not-to-scale schematic drawing that illustrates how the combiner described in FIG. 4 would be connected in a solar field for maximum benefit.

FIG. 5A illustrates the optimum solar module arrangement for the sub-combiner illustrated in FIG. 4 where series strings A through F are arranged in a row so that four positive conductors of four unique series strings terminate at a common location and where four negative conductors of four unique series strings terminate at a common location along the length of a row. The row shown is comprised of eight series strings but could be much longer and is only limited in length by the cross sectional area of DC buss conductors 102 and 202.

Figure 5B:
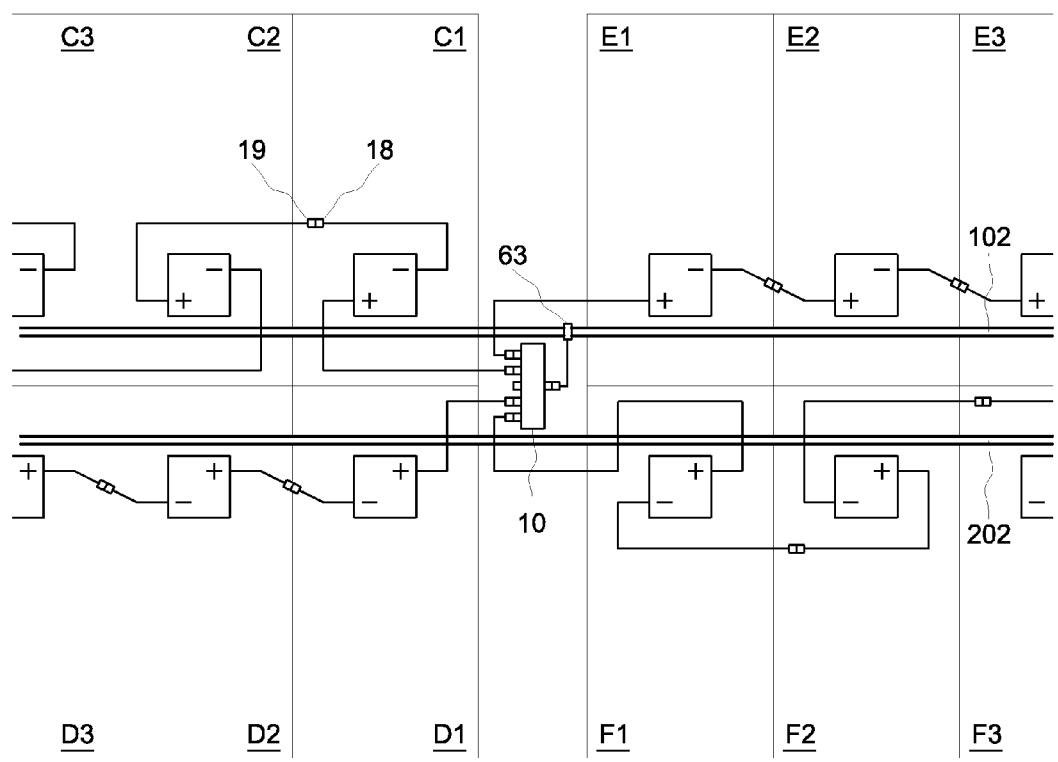

FIG. 5B is a detail of the FIG. 5A area bounded by dashed lines. FIG. 5B is not to scale and is use here to schematically illustrate how sub-combiner 10 is connected to four unique series string circuits using only the standard terminations supplied with the solar modules. Module-to-module connections 18 and 19 are also made as intended with the standard manufacturer-supplied connectors. In this example, the output of combiner 10 is connected to positive DC bus conductor 102 with self-sealing, insulation displacement tap connector 63. Buss conductor 102 could, for example, be a typical stranded conductor with RHW-2 insulation, an insulated aluminum buss bar or any other method for efficiently conducting higher cumulative currents than could be handled by "standard" MC4 type connectors.

Figure 6A:
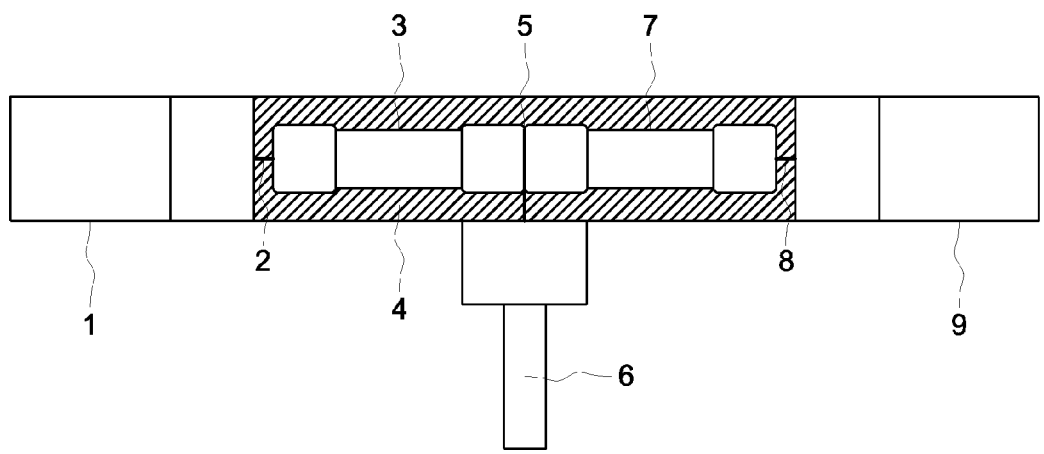
FIG. 6 illustrates a layout and electrical connections for a two input combiner with one output.
Figure 6B:
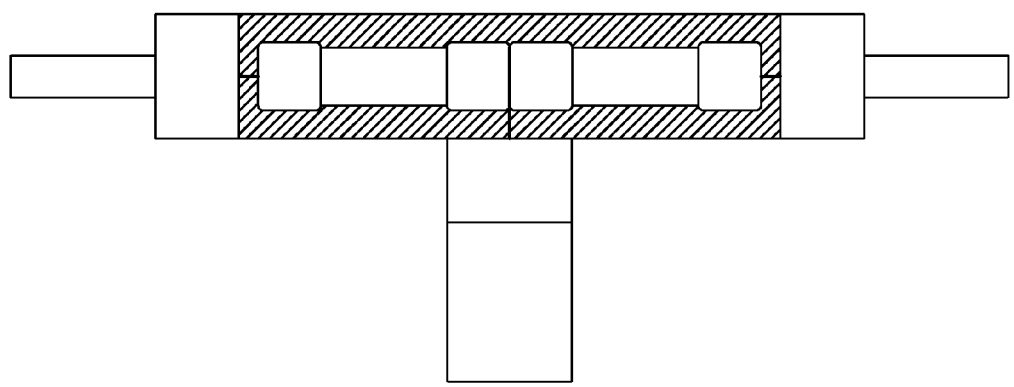

FIG. 6A shows the simplest embodiment of the invention as a three port device with male MC4 connector-based lower current input ports 1 and 9 to conduct current through electrical contacts 2 and 8 and through fuses 3 and 7, respectively, to a common higher current connection point 5 and female MC4 connector 6. The combiner assembly is injection molded as a single piece from an electrically insulating and physically robust and sunlight resistant plastic. FIG. 6B is for connection to negative PV module terminals but is otherwise analogous in function and construction to the combiner described in FIG. 6A. Each combiner may also have provisions, not shown, for mounting the combiners to the array structure. These provisions may include mounting holes to facilitate mounting with a plastic tie-wrap fastener.

In an additional photovoltaic combiner embodiment, not illustrated, combiner fuses are replaced by diodes. The diodes serve the same function as the fuses by preventing damaging backfed currents in series string conductors and series connected solar modules. The use of diodes also supports the basic utility of the invention; that of providing a maintenance-free, touch-safe distributed method of combining circuits. Both fuses and diodes generate waste heat under normal operating conditions and, as such, all other parameters and disclosures associated with the fuse-based invention would be equivalent in a diode-based solution with the exception that there would be more heat to be removed using the diode solution.

What I claim as my invention is:

1. A photovoltaic string combiner comprising an enclosure, at least two photovoltaic string input connectors, at least one output connector and at least two fuses for coupling the at least two photovoltaic string input connectors to the at least one output connector wherein;
   said at least two fuses are internal to said enclosure and wherein;
   said enclosure is environmentally sealed, touch safe contains no user serviceable parts, and is designed to support plug and play replacement of the photovoltaic combiner when a fuse is cleared and wherein;
   said at least two fuses provide means for overcurrent protection and wherein;
   said enclosure comprises a means for preventing user access to said fuses and wherein if said means for preventing user access is breached, then the enclosure will no longer be environmentally sealed and said means for overcurrent protection will be compromised and wherein;
   said at least two photovoltaic string input connectors and said at least one output connector are accessible external to the enclosure.

2. The photovoltaic string combiner according to claim 1 further comprising a power collection bus input connector coupled to said at least one output connector.

3. The photovoltaic string combiner according to claim 2 comprising two photovoltaic string input connectors, one power collection bus input connector and one output connector.

4. The photovoltaic string combiner according to claim 2 comprising four photovoltaic string input connectors, one power collection bus input connector and one output connector.

5. The photovoltaic string combiner according to claim 1 wherein said photovoltaic string input connectors are coupled to said at least two fuses without the use of fuse holders or fuse clips.

6. The photovoltaic string combiner according to claim 1 further comprising a printed circuit board wherein said at least two fuses are soldered to the printed circuit board.

7. The photovoltaic string combiner according to claim 1 wherein at least one connector is a bulkhead mounted connector which mates with industry standard photovoltaic module connectors.

8. The photovoltaic string combiner according to claim 1 wherein the enclosure is environmentally sealed at the time of manufacture by gluing, welding or otherwise permanently affixing a cover.

9. The photovoltaic string combiner according to claim 1 further comprising an electrically insulating material applied to the interior of the enclosure.

10. The photovoltaic string combiner according to claim 1 further comprising an electrically insulating potting, casting or molding material used as a portion of the enclosure.

11. The photovoltaic string combiner according to claim 1 further comprising a tap connector, where the tap connector is coupled to said at least one output connector and is an insulation displacement type comprising a means for coupling to an external electrical buss or electrical conductor without breaking that buss or conductor.

12. A photovoltaic power system comprising at least one photovoltaic string combiners according to claim 1 wherein a plurality of photovoltaic series strings are combined within said at least one photovoltaic string combiner at a field terminus location of said plurality of photovoltaic series strings.

13. The photovoltaic power system according to claim 12 wherein the outputs of a plurality of photovoltaic string combiners are coupled in a daisy chain configuration.

14. The photovoltaic power system according to claim 12 wherein the outputs of a plurality of the photovoltaic string combiners are coupled to an external power collection bus.

15. A method for collecting DC power in a photovoltaic power system comprising at least one photovoltaic string combiner according to claim 1, the method combining a plurality of photovoltaic series strings within said at least one photovoltaic string combiner at a field terminus location of said plurality of photovoltaic series strings, and providing an output at at least one of the at least one output connectors.

16. A method for collecting DC power in a photovoltaic power system according to claim 15 wherein the outputs of a plurality of photovoltaic string combiners are combined using a daisy chain configuration.

17. A method for collecting DC power in a photovoltaic power system according to claim 15 wherein the outputs of a plurality of photovoltaic string combiners are coupled to an external power collection bus.

18. The photovoltaic string combiner according to claim 1 comprising two photovoltaic string input connectors, two fuses and one output connector.

19. The photovoltaic string combiner according to claim 1 comprising two photovoltaic string input connectors, two fuses and one output connector and wherein the enclosure is made of injection molded plastic.

20. The photovoltaic string combiner according to claim 1 comprising four photovoltaic string input connectors, four fuses and one output connector.

* * * * *